US009012991B2

(12) United States Patent
Kuwazawa

(10) Patent No.: US 9,012,991 B2
(45) Date of Patent: Apr. 21, 2015

(54) SEMICONDUCTOR DEVICE

(71) Applicant: Seiko Epson Corporation, Tokyo (JP)

(72) Inventor: Kazunobu Kuwazawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/449,806

(22) Filed: Aug. 1, 2014

(65) Prior Publication Data

US 2015/0035056 A1      Feb. 5, 2015

(30) Foreign Application Priority Data

Aug. 5, 2013   (JP) .................................. 2013-162289

(51) Int. Cl.
| | | |
|---|---|---|
| *H01L 29/78* | (2006.01) | |
| *H01L 29/10* | (2006.01) | |
| *H01L 29/423* | (2006.01) | |
| *H01L 23/48* | (2006.01) | |
| *H01L 29/417* | (2006.01) | |

(52) U.S. Cl.
CPC ........ *H01L 29/7816* (2013.01); *H01L 29/1095* (2013.01); *H01L 29/4232* (2013.01); *H01L 23/481* (2013.01); *H01L 29/41725* (2013.01)

(58) Field of Classification Search
CPC . H01L 29/78; H01L 29/7816; H01L 29/4232; H01L 27/146
USPC .................................................. 257/343, 292
See application file for complete search history.

(56) References Cited

U.S. PATENT DOCUMENTS

| | | | |
|---|---|---|---|
| 6,576,955 B2 | 6/2003 | Kubo | |
| 6,873,053 B2 | 3/2005 | Hino et al. | |
| 7,271,412 B2 * | 9/2007 | Kwak | ............................. 257/59 |
| 7,372,164 B2 | 5/2008 | Hino et al. | |
| 7,417,282 B2 * | 8/2008 | Jang et al. | ..................... 257/328 |
| 7,422,933 B2 * | 9/2008 | Isikawa | ......................... 438/149 |
| 7,465,990 B2 * | 12/2008 | Yamauchi et al. | ............ 257/341 |
| 7,535,057 B2 * | 5/2009 | Yang | ............................. 257/335 |
| 7,535,058 B2 * | 5/2009 | Liu et al. | ....................... 257/335 |
| 7,537,983 B2 * | 5/2009 | Uchihara et al. | .............. 438/163 |
| 7,872,354 B2 | 1/2011 | Yakuwa | |
| 8,258,059 B2 | 9/2012 | Yakuwa | |
| 8,330,219 B2 | 12/2012 | Furuhata et al. | |
| 2013/0062694 A1 | 3/2013 | Furuhata et al. | |

FOREIGN PATENT DOCUMENTS

| | | |
|---|---|---|
| JP | A-2001-244422 | 9/2001 |
| JP | A-2002-050760 | 2/2002 |
| JP | A-2002-064206 | 2/2002 |
| JP | A-2007-053399 | 3/2007 |
| JP | A-2009-164417 | 7/2009 |
| JP | A-2009-231443 | 10/2009 |
| JP | A-2010-016155 | 1/2010 |

* cited by examiner

*Primary Examiner* — Nathan Ha
(74) *Attorney, Agent, or Firm* — Oliff PLC

(57) ABSTRACT

A semiconductor device includes an $N^-$-type well 13, a P-type body diffusion layer 14, an $N^+$-type source diffusion layer 18, an $N^+$-type drain diffusion layer 19, and a $P^+$-type body contact region 32. A plurality of the $P^+$-type body contact regions 32 are located along gate electrodes 17a and 17b, a plurality of first contact holes 25 are located along the gate electrodes, and a plurality of second contact holes 27 are located along the gate electrodes. The pitch of the plurality of $P^+$-type body contact regions 32 is larger than the pitch of the plurality of first contact holes 25.

8 Claims, 8 Drawing Sheets

SEMICONDUCTOR DEVICE

BACKGROUND

1. Technical Field

The present invention relates to a semiconductor device.

2. Related Art

A conventional N-channel LDMOS (Lateral Diffused MOS) will be described. The N-channel LDMOS includes a gate electrode formed above a well in a silicon substrate, a P-type body diffusion layer formed in the well to one side of the gate electrode so as to overlap with the gate electrode, a channel region formed in the P-type body diffusion layer and located under the gate electrode, a plurality of P$^+$-type body contact regions and an N$^+$-type source diffusion layer formed in the P-type body diffusion layer, and an N$^+$-type drain diffusion layer formed in the silicon substrate to the other side of the gate electrode (see JP-A-2010-16155, for example).

An interlayer insulation film is formed over the well, the P-type body diffusion layer, and the gate electrode. A first contact hole that establishes contact with the N$^+$-type source diffusion layer, a second contact hole that establishes contact with the N$^+$-type drain diffusion layer, and a third contact hole that establishes contact with the P$^+$-type body contact region are formed in the interlayer insulation film.

In the above N-channel LDMOS, reduction of resistance between the N$^+$-type source diffusion layer and the N$^+$-type drain diffusion layer is required in order to facilitate the flow of a large current. This can be favorably achieved by increasing the number of first contact holes and second contact holes.

SUMMARY

Some aspects of the invention relate to a semiconductor device in which a contact resistance is reduced by increasing the number of contact holes.

An aspect of the invention is a semiconductor device that includes a first conductivity type first diffusion layer located in a semiconductor layer; a gate electrode located over the first diffusion layer and the semiconductor layer via a gate insulation film; a second conductivity type second diffusion layer that is one of a source region and a drain region, and is located in the first diffusion layer to one side of the gate electrode in a channel length direction; a second conductivity type third diffusion layer that is the other of the source region and the drain region, and is located in the semiconductor layer to the other side of the gate electrode in the channel length direction; a plurality of first conductivity type fourth diffusion layers that are located in the second diffusion layer and are electrically connected to the first diffusion layer; an insulation film that is located over the semiconductor layer, the first diffusion layer, and the gate electrode; a plurality of first contact holes that are located in the insulation film, and are located over the second diffusion layer and the fourth diffusion layer; and a plurality of second contact holes that are located in the insulation film, and are located over the third diffusion layer. The plurality of fourth diffusion layers are located along the gate electrode, and each of the plurality of fourth diffusion layers is surrounded by the second diffusion layer. The plurality of first contact holes are located along the gate electrode, the plurality of second contact holes are located along the gate electrode, and a pitch of the plurality of fourth diffusion layers is larger than a pitch of the plurality of first contact holes. Accordingly, the number of the first contact holes that are located over the second diffusion layer can be increased, and a contact resistance between the second diffusion layer and the first contact holes can be reduced.

Note that the above semiconductor layer includes a semiconductor substrate, an epitaxial layer, and a well, and also includes an impurity diffusion layer located in the semiconductor substrate or the semiconductor layer.

In an aspect of the invention, it may be that the plurality of fourth diffusion layers are located in a line along the gate electrode, the plurality of first contact holes are located in a line along the gate electrode, the plurality of second contact holes are located in a line along the gate electrode, and the pitch of the plurality of first contact holes is the same as the pitch of the plurality of second contact holes. Accordingly, due to making the pitch of the plurality of first contact holes the same as the pitch of the plurality of second contact holes, the number of the first contact holes that are located over the second diffusion layer can be increased, even if the pitch of the plurality of fourth diffusion layers is larger than the pitch of the plurality of first contact holes. The contact resistance between the second diffusion layer and the first contact holes can thereby be reduced.

Also, in an aspect of the invention, the plurality of first contact holes may include a contact hole that overlaps with the second diffusion layer and does not overlap with the fourth diffusion layer, and a contact hole that overlaps with the fourth diffusion layer and does not overlap with the second diffusion layer.

Also, in an aspect of the invention, the plurality of first contact holes may include a contact hole that overlaps with the second diffusion layer and the fourth diffusion layer. Accordingly, the contact resistance between the second diffusion layer and the first contact holes can be reduced.

Also, in an aspect of the invention, at least one of the plurality of fourth diffusion layers may not overlap with any of the plurality of first contact holes.

Also, in an aspect of the invention, the plurality of first contact holes may include a contact hole that establishes contact with the second diffusion layer and a contact hole that establishes contact with the fourth diffusion layer.

Also, in an aspect of the invention, the plurality of first contact holes may include a contact hole that establishes contact with both the second diffusion layer and one of the fourth diffusion layers.

Accordingly, a contact resistance between the second diffusion layer and the first contact holes can be reduced.

Also, in an aspect of the invention, at least one of the plurality of fourth diffusion layers may not have contact with any of the plurality of first contact holes.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. Note that the invention is not limited to the following description. Those skilled in the art will appreciate that various modifications can be made to the configurations and details of the invention without departing from the gist or scope thereof. Accordingly, the invention is not to be construed as being limited to the following description of embodiments.

Embodiment 1

Figure 1:
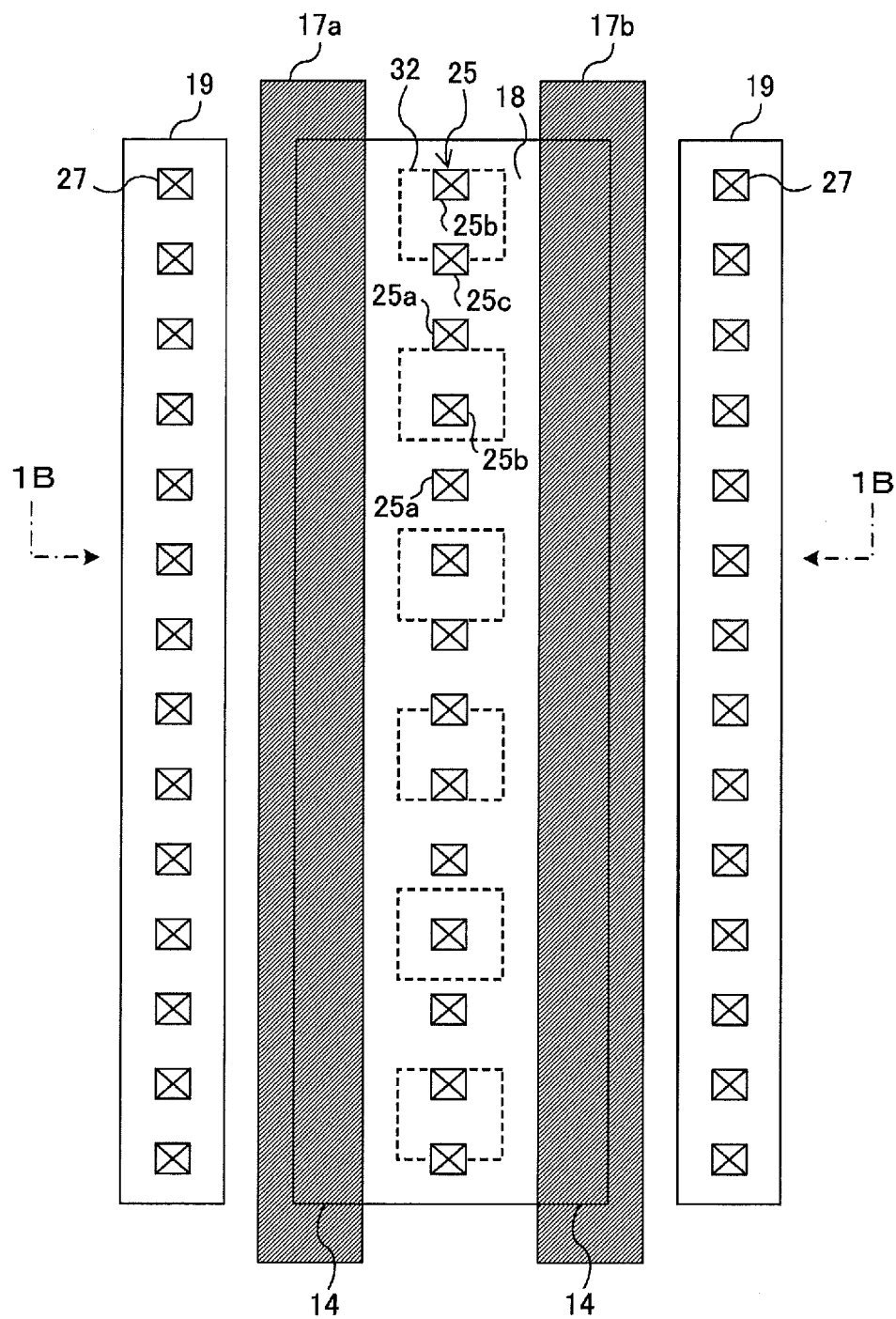
FIG. 1 is a plan view illustrating a semiconductor device according to an aspect of the invention.
Figure 2:
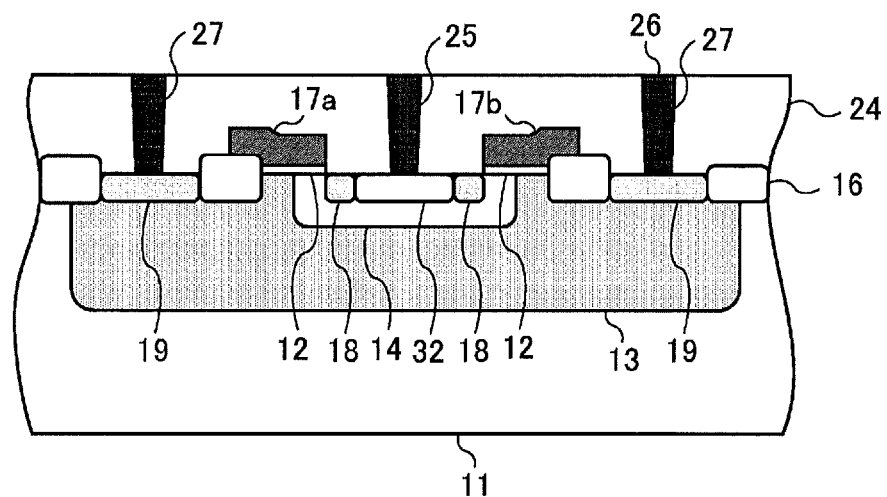
FIG. 2 is a cross-sectional view taken along line 1B-1B in FIG. 1.

FIG. 1 is a plan view illustrating a semiconductor device according to an aspect of the invention. FIG. 2 is a cross-sectional view taken along line 1B-1B in FIG. 1. The semiconductor device is an N-channel LDMOS.

As shown in FIG. 2, an $N^-$-type well 13 is located in a P-type silicon substrate 11. A LOCOS oxide film 16 is located on a surface of the $N^-$-type well 13. Regions where the LOCOS oxide film 16 is not located are active regions where sources and drains are located. A gate insulation film 12 is formed on the surface of the $N^-$-type well 13 where the LOCOS oxide film 16 is not located.

A P-type body diffusion layer 14 is located in the $N^-$-type well 13 as a result of introducing P-type impurities into the $N^-$-type well 13. Gate electrodes 17a and 17b are located on the LOCOS oxide films 16 and the gate insulation films 12. The gate electrodes 17a and 17b are formed by forming a polysilicon film and processing the polysilicon film.

An $N^+$-type source diffusion layer 18 is located in the P-type body diffusion layer 14, and an $N^+$-type drain diffusion layer 19 is located in the $N^-$-type well 13. A $P^+$-type body contact region 32 for connecting to the P-type body diffusion layer 14 are located in the $N^+$-type source diffusion layer 18.

An interlayer insulation film 24 is located over the whole surface including the $N^-$-type well 13, the P-type body diffusion layer 14, the gate electrodes 17a and 17b, and the LOCOS oxide films 16. A plurality of first contact holes 25 and a plurality of second contact holes 27 are located in the interlayer insulation film 24. The first and second contact holes 25 and 27 are filled with a conductive film 26.

As shown in FIG. 1, a plurality of $P^+$-type body contact regions 32 are located to one side of the gate electrodes 17a and 17b in a channel length direction. The plurality of $P^+$-type body contact regions 32 are located in a line along the gate electrodes 17a and 17b, and the $P^+$-type body contact regions 32 are connected to the P-type body diffusion layer 14. The $N^+$-type source diffusion layer 18 is located around the plurality of $P^+$-type body contact regions 32, and the $N^+$-type source diffusion layer 18 is located between the plurality of $P^+$-type body contact regions 32.

The plurality of first contact holes 25 are located in a line along the gate electrodes 17a and 17b, and the plurality of second contact holes 27 are located in a line along the gate electrodes 17a and 17b. The pitch of the plurality of first contact holes 25 is the same as the pitch of the plurality of second contact holes 27. The smaller this pitch the better, because the number of contact holes can be increased by reducing the pitch. This pitch is preferably the minimum pitch according to a design rule. Also, this pitch is preferably 2.0 µm or less, for example, and more preferably, 1.2 µm or less.

The pitch of the plurality of first contact holes 25 is the same as the pitch of the plurality of second contact holes 27. Also, the pitch of the plurality of $P^+$-type body contact regions 32 is larger than the pitch of the plurality of first contact holes 25.

Note that, in the specification, "pitch" refers to a distance between the centers of adjacent patterns, and, specifically, refers to the distance between the centers of patterns of adjacent $P^+$-type body contact regions 32, the distance between the centers of patterns of adjacent first contact holes 25, and the distance between the centers of patterns of adjacent second contact holes 27, in the plan view shown in FIG. 1.

Also, in the specification, "the pitch is "the same"" refers to not only a case of being exactly the same, but also to a case where the size of a pitch of one is in a range of 90% or more to less than 100% of the size of a pitch of the other. It is natural that a slight error occurs when during actual processing.

The second contact holes 27 are a plurality of drain contact holes for connecting to the $N^+$-type drain diffusion layer 19 that is located to the other side of the gate electrodes 17a and 17b in the channel length direction.

The first contact holes 25 includes three types of contact holes, namely a source contact hole 25a that is located over the $N^+$-type source diffusion layer 18, a body contact hole 25b that is located over the $P^+$-type body contact region 32, and a source/body contact hole 25c that is located over both the $N^+$-type source diffusion layer 18 and the $P^+$-type body contact region 32. In the LDMOS of the present embodiment, it is possible to establish contact with both the $N^+$-type source diffusion layer 18 and the $P^+$-type body contact regions 32, since the potential of the $N^+$-type source diffusion layer 18 is the same as the potential of the $P^+$-type body contact regions 32.

The source contact hole 25a is a contact hole that establishes contact with the $N^+$-type source diffusion layer 18. The body contact hole 25b is a contact hole that establishes contact with the $P^+$-type body contact region 32. The source/body contact hole 25c is a contact hole that establishes contact with both the $N^+$-type source diffusion layer 18 and the $P^+$-type body contact region 32.

In other words, each source contact hole 25a is a contact hole that overlaps with the $N^+$-type source diffusion layer 18 and does not overlap with the $P^+$-type body contact region 32. Each body contact hole 25b overlaps with the $P^+$-type body contact region 32 and does not overlap with the $N^+$-type source diffusion layer 18. Each source/body contact hole 25c overlaps with both the $N^+$-type source diffusion layer 18 and the $P^+$-type body contact region 32. Also, at least one of the plurality of $P^+$-type body contact regions 32 overlaps with both the body contact hole 25b and the source/body contact hole 25c.

Note that, in the specification, "overlapping" refers to a state in which an upper layer pattern and a lower layer pattern overlap each other in plan view, and, specifically, in the plan view shown in FIG. 1, refers to a state in which a contact hole pattern and a pattern of a diffusion layer or a region thereunder overlap each other. Also, "not overlapping" refers to a state in which an upper layer pattern and a lower layer pattern do not overlap each other in plan view, and, specifically, in the plan view shown in FIG. 1, refers to a state in which a contact hole pattern does not overlap with a pattern of a diffusion layer or a region.

Comparative Example

Figure 3:
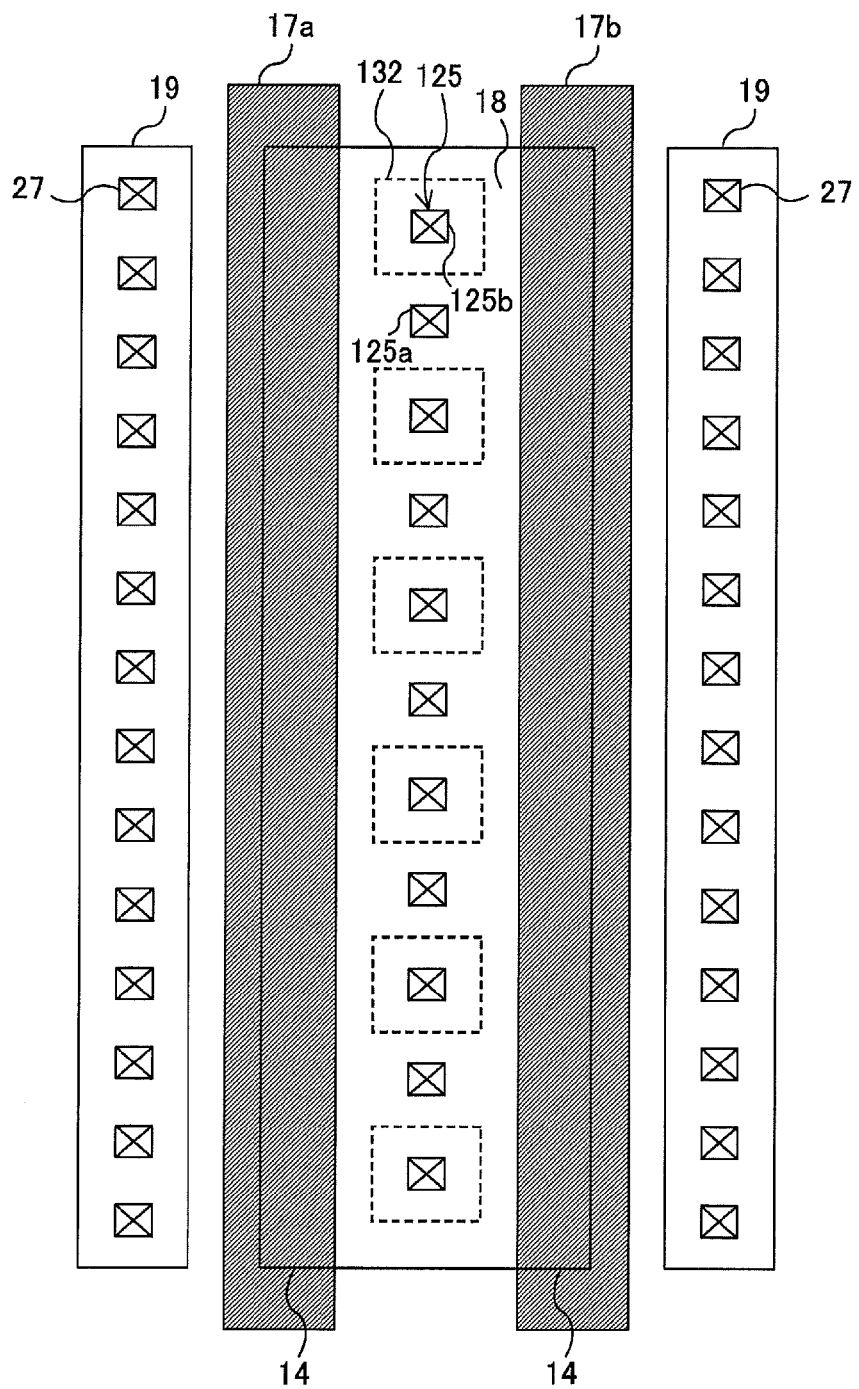
FIG. 3 is a plan view illustrating a comparative example of an N-channel LDMOS.

FIG. 3 is a plan view illustrating a comparative example of an N-channel LDMOS, and portions that are similar to those of FIG. 1 are given the same reference signs, and only different portions will be described.

As shown in FIG. 3, a plurality of P$^+$-type body contact regions 132 are located in a line along the gate electrodes 17a and 17b. Each of the plurality of P$^+$-type body contact regions 32 are surrounded by the N$^+$-type source diffusion layer 18.

A plurality of first contact holes 125 are located in a line along the gate electrodes 17a and 17b. The pitch of the plurality of first contact holes 125 is larger than the pitch of the plurality of second contact holes 27.

The pitch of the plurality of P$^+$-type body contact regions 132 is larger than the pitch of the plurality of second contact holes 27.

The first contact holes 125 include two types of contact holes, namely, a source contact hole 125a that is located over the N$^+$-type source diffusion layer 18 and a body contact hole 125b that is located over the P$^+$-type body contact region 132. The source contact holes 125a and the body contact holes 125b are disposed alternately.

The source contact hole 125a is a contact hole that establishes contact with the N$^+$-type source diffusion layer 18. The body contact hole 125b is a contact hole that establishes contact with the P$^+$-type body contact region 132.

In the N-channel LDMOS of the above comparative example, in order to facilitate the flow of a large current by reducing a resistance between the N$^+$-type source diffusion layer 18 and the N$^+$-type drain diffusion layer 19, the plurality of second contact holes 27 that are disposed in a line are disposed at the minimum pitch according to a design rule, and the plurality of P$^+$-type body contact regions 132 that are disposed in a line are disposed at the minimum pitch according to the design rule. As a result, the pitch of the plurality of P$^+$-type body contact regions 132 is larger than the pitch of the plurality of second contact holes 27. Also, since the source contact holes 125a are disposed over the N$^+$-type source diffusion layer 18, and the body contact holes 125b are disposed over the respective P$^+$-type body contact regions 132, the pitch of the first contact holes 125 is larger than the pitch of the second contact holes 27. As a result, the number of the source contact holes 125a is reduced, and the source contact resistance cannot be reduced sufficiently, thus preventing the resistance between the N$^+$-type source diffusion layer 18 and the N$^+$-type drain diffusion layer 19 from being reduced sufficiently.

In contrast, in Embodiment 1, the pitch of the plurality of first contact holes 25 is formed to be the same as the pitch of the plurality of second contact holes 27, by eliminating the design concept that the source contact holes 25a are disposed on the N$^+$-type source diffusion layer 18 and the body contact holes 25b are disposed on the P$^+$-type body contact regions 32. As a result, although the number of the source contact holes 125a is five in the N-channel LDMOS of the comparative example shown in FIG. 3, the number of the source contact holes 125a in the N-channel LDMOS of Embodiment 1 can be increased to the equivalent of 6.5 source contact holes, since three source/body contact holes 25c can be disposed, and the three source/body contact holes 25c are converted to the equivalent of 1.5 source contact holes. By increasing the number of the source contact holes in this way, the source contact resistance can be reduced, which contributes to the improvement of the on-resistance.

Note that, since the potential of the N$^+$-type source diffusion layer 18 is the same as the potential of the P$^+$-type body contact region 32, a configuration in which a silicide film is arranged between the interlayer insulation film 24 and the N$^+$-type source diffusion layer 18 and the P$^+$-type body contact region 32, respectively, may be added to the present embodiment.

Embodiment 2

Figure 4:
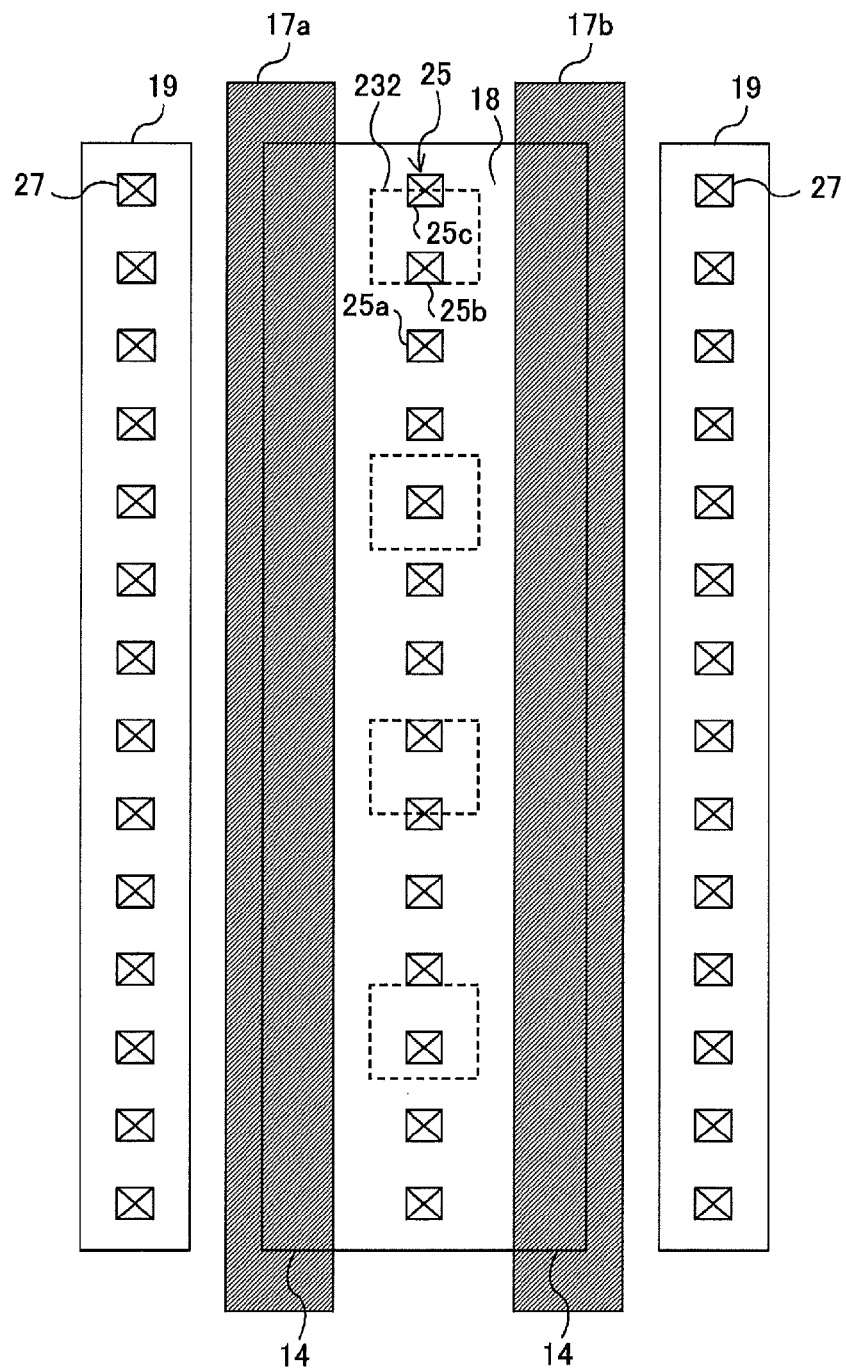
FIG. 4 is a plan view illustrating a semiconductor device according to an aspect of the invention.

FIG. 4 is a plan view illustrating a semiconductor device according to an aspect of the invention, and portions that are similar to those of FIG. 1 are given the same reference signs, and only different portions will be described.

The pitch of a plurality of P$^+$-type body contact regions 232 shown in FIG. 4 is larger than the pitch of the plurality of P$^+$-type body contact regions 32 shown in FIG. 1.

The same effects as those in Embodiment 1 can also be obtained in the present embodiment. Specifically, in the N-channel LDMOS of the present embodiment, two source/body contact holes 25c can be disposed, and considering that the two source/body contact holes 25c are converted to the equivalent of one source contact hole, the number of the source contact holes 25a can be increased to the equivalent of nine source contact holes.

Embodiment 3

Figure 5:
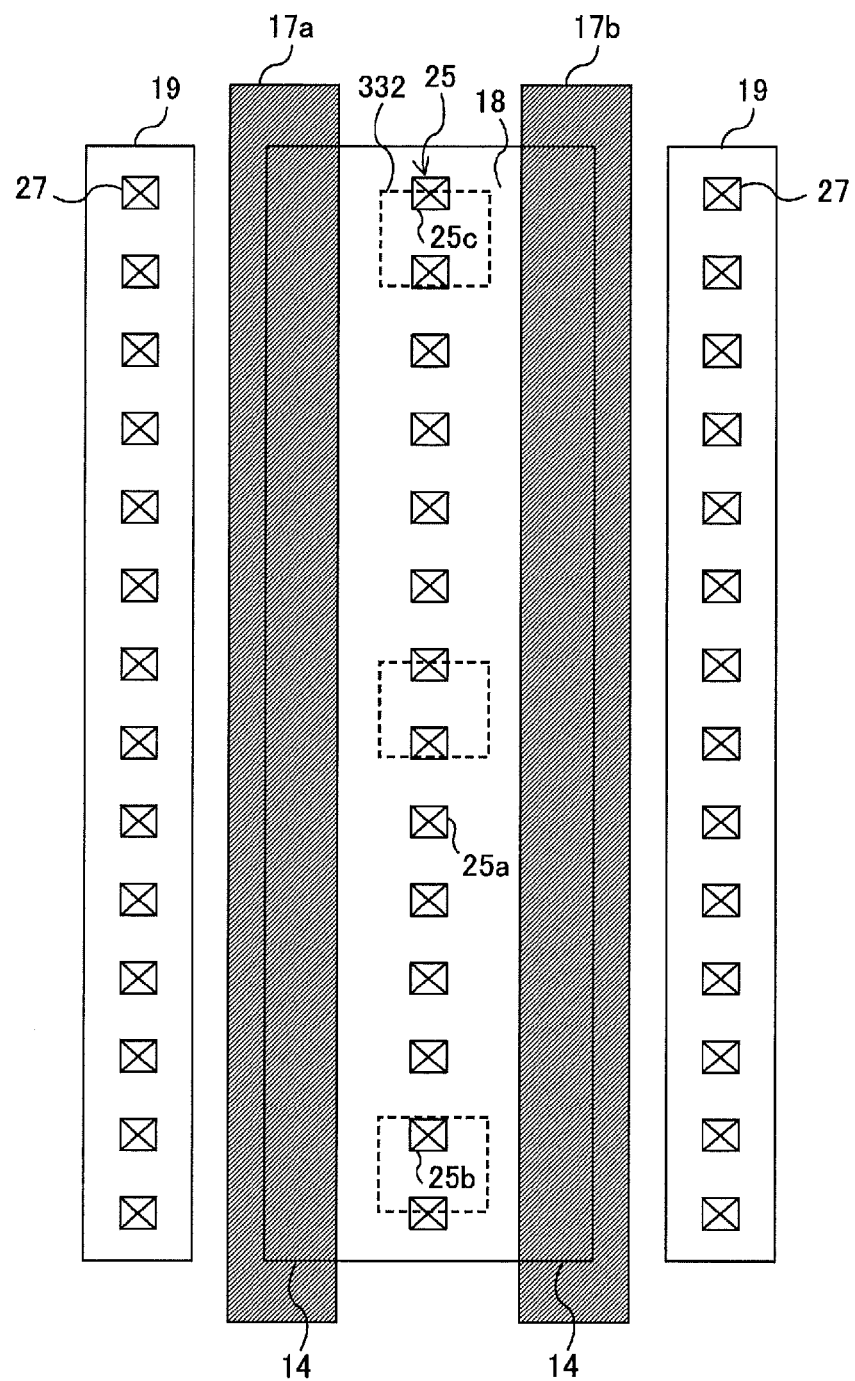
FIG. 5 is a plan view illustrating a semiconductor device according to an aspect of the invention.

FIG. 5 is a plan view illustrating a semiconductor device according to an aspect of the invention, and portions that are similar to those of FIG. 4 are given the same reference signs, and only different portions will be described.

The pitch of a plurality of P$^+$-type body contact regions 332 shown in FIG. 5 is larger than the pitch of the plurality of P$^+$-type body contact regions 232 shown in FIG. 4.

The same effects as those in Embodiment 2 can also be obtained in the present embodiment. Specifically, in the N-channel LDMOS of the present embodiment, three source/body contact holes 25c can be disposed, and considering that the three source/body contact holes 25c are converted to the equivalent of 1.5 source contact holes, the number of the source contact holes 25a can be increased to the equivalent of 9.5 source contact holes.

Embodiment 4

Figure 6:
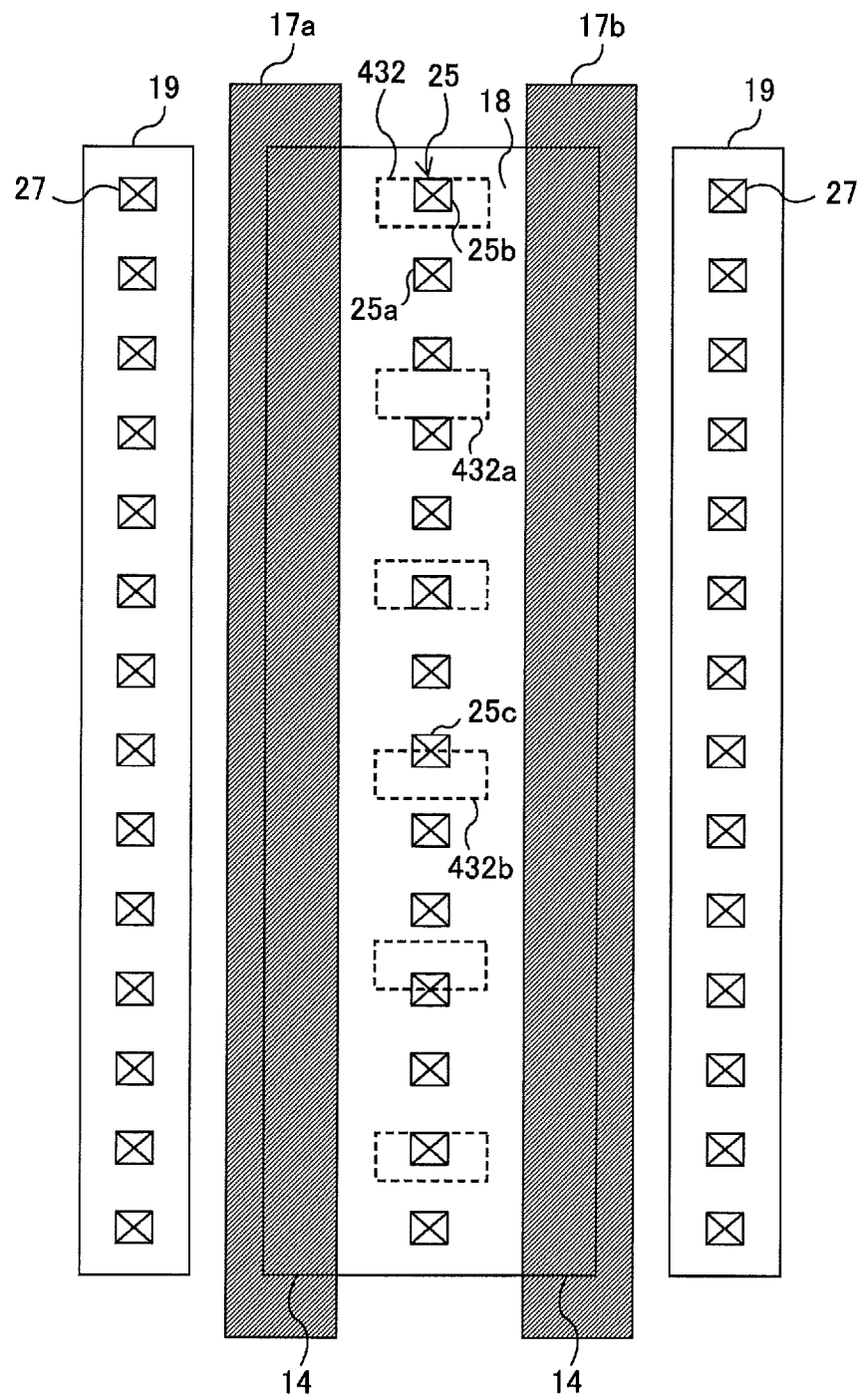
FIG. 6 is a plan view illustrating a semiconductor device according to an aspect of the invention.

FIG. 6 is a plan view illustrating a semiconductor device according to an aspect of the invention, and portions that are similar to those of FIG. 1 are given the same reference signs, and only different portions will be described.

The size (area) of each of a plurality of P$^+$-type body contact regions 432 shown in FIG. 6 is smaller than the size of each of the plurality of P$^+$-type body contact regions 32 shown in FIG. 1.

At least one of the plurality of P$^+$-type body contact regions 432 does not overlap with either the body contact hole 25b or the source/body contact hole 25c. That is, at least one P$^+$-type body contact region 432a among the P$^+$-type body contact regions 432 does not overlap with the first contact hole 25.

Also, at least one P$^+$-type body contact region 432b among the P$^+$-type body contact regions 432 is positioned under only the source/body contact hole 25c, and is not positioned under the body contact hole 25b.

The same effects as those in Embodiment 1 can also be obtained in the present embodiment. Specifically, in the N-channel LDMOS of the present embodiment, two source/body contact holes 25c can be disposed, and considering that the two source/body contact holes 25c are converted to the equivalent of one source contact hole, the number of the source contact holes 25a can be increased to the equivalent of ten source contact holes.

Embodiment 5

Figure 7:
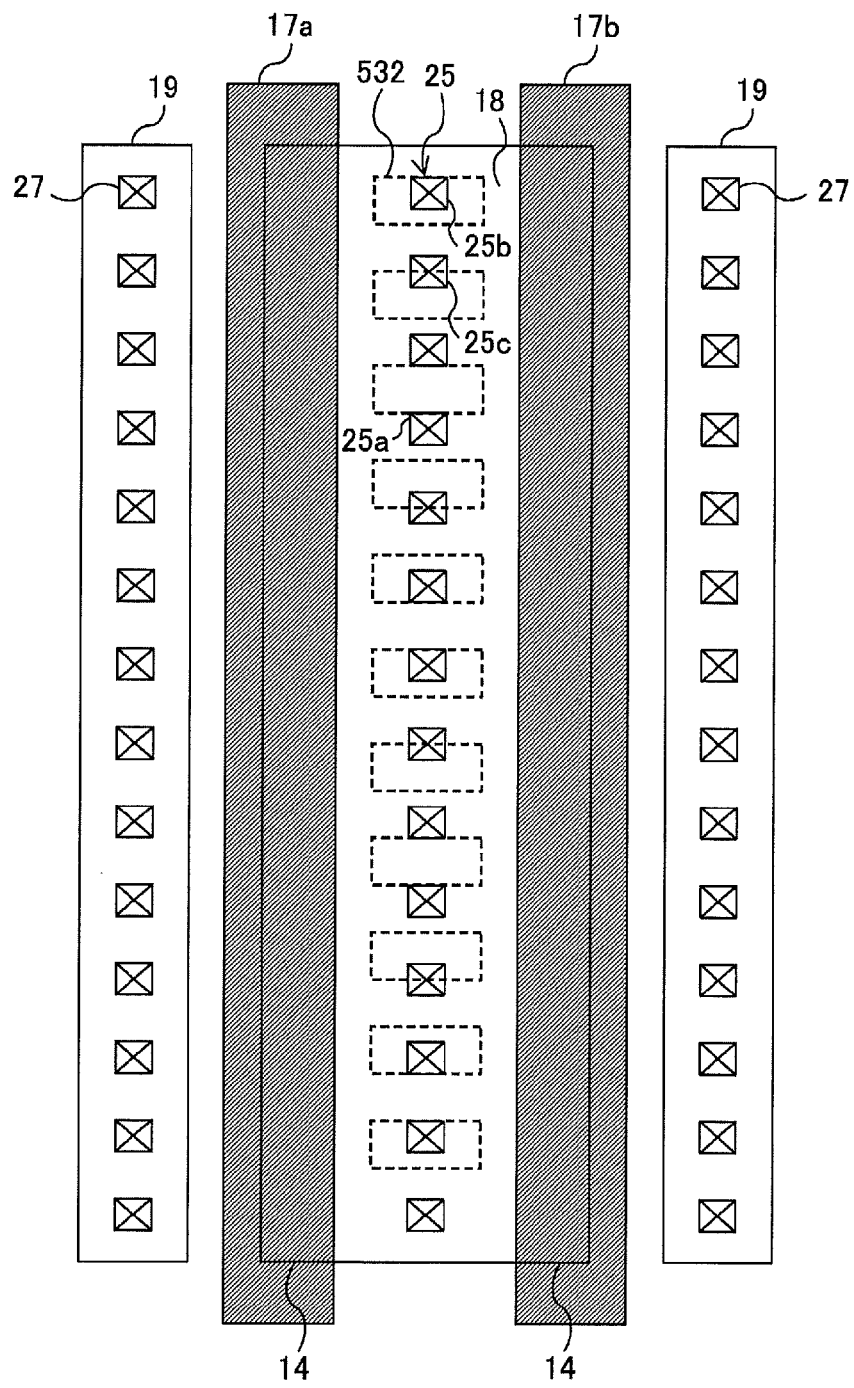
FIG. 7 is a plan view illustrating a semiconductor device according to an aspect of the invention.

FIG. 7 is a plan view illustrating a semiconductor device according to an aspect of the invention, and portions that are similar to those of FIG. 1 are given the same reference signs, and only different portions will be described.

The size (area) of each of a plurality of $P^+$-type body contact regions 532 shown in FIG. 7 is smaller than the size of each of the plurality of $P^+$-type body contact regions 32 shown in FIG. 1. Also, the pitch of the plurality of $P^+$-type body contact regions 532 shown in FIG. 7 is smaller than the pitch of the plurality of $P^+$-type body contact regions 32 shown in FIG. 1.

The same effects as those in Embodiment 1 can also be obtained in the present embodiment. Specifically, in the N-channel LDMOS of the present embodiment, four source/body contact holes 25c can be disposed, and considering that the four source/body contact holes 25c are converted to the equivalent of two source contact holes, the number of the source contact holes 25a can be increased to the equivalent of seven source contact holes.

Embodiment 6

Figure 8:
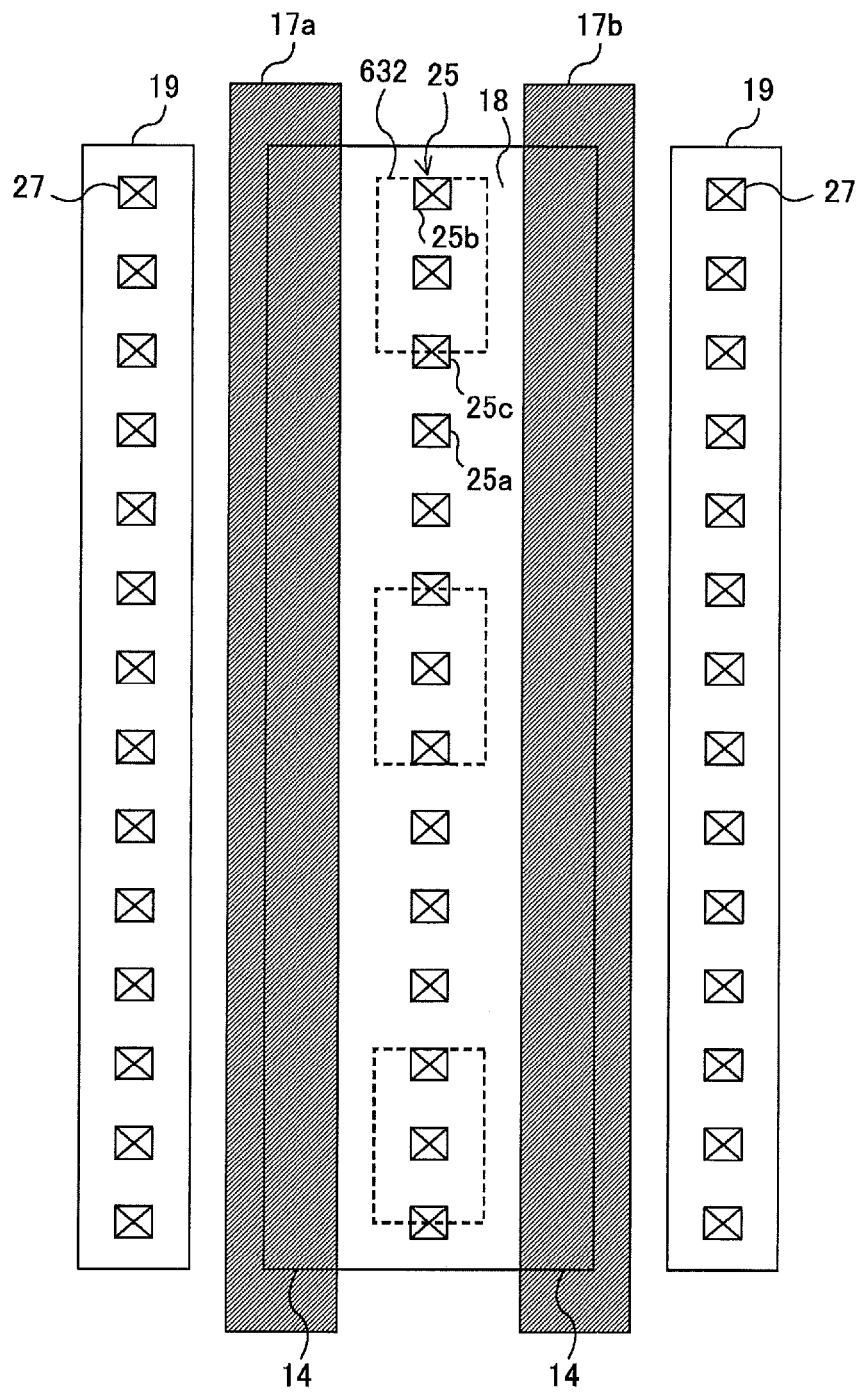
FIG. 8 is a plan view illustrating a semiconductor device according to an aspect of the invention.

FIG. 8 is a plan view illustrating a semiconductor device according to an aspect of the invention, and portions that are similar to those of FIG. 1 are given the same reference signs, and only different portions will be described.

The size (area) of each of a plurality of $P^+$-type body contact regions 632 shown in FIG. 8 is larger than the size of each of the plurality of $P^+$-type body contact regions 32 shown in FIG. 1. Also, the pitch of the plurality of $P^+$-type body contact regions 632 shown in FIG. 8 is larger than the pitch of the plurality of $P^+$-type body contact regions 32 shown in FIG. 1.

The same effects as those in Embodiment 1 can also be obtained in the present embodiment. Specifically, in the N-channel LDMOS of the present embodiment, three source/body contact holes 25c can be disposed, and considering that the three source/body contact holes 25c are converted to the equivalent of 1.5 source contact holes, the number of the source contact holes 25a can be increased to the equivalent of 6.5 source contact holes.

Note that, in Embodiments 1 to 6, the $N^-$-type well 13 may be replaced by a semiconductor layer, the P-type body diffusion layer 14 may be replaced by a first diffusion layer, the $N^+$-type source diffusion layer 18 may be replaced by a second diffusion layer, the $N^+$-type drain diffusion layer 19 may be replaced by a third diffusion layer, and the $P^+$-type body contact region 32 may be replaced by a fourth diffusion layer.

Also, the invention may be implemented by combining the above Embodiments 1 to 6 as appropriate.

Note that when a specific B (referred to as "B" below) is located over a specific A (referred to as "A" below) in the invention, the invention is not limited to the case of B being located directly on or under A. Cases in which B is located on A via another object without inhibiting the effect of the invention are also included.

The entire disclosure of Japanese Patent Application No. 2013-162289, filed Aug. 5, 2013 is expressly incorporated by reference herein.

What is claimed is:

1. A semiconductor device comprising:
   a first conductivity type first diffusion layer located in a semiconductor layer;
   a gate electrode located over the first diffusion layer and the semiconductor layer via a gate insulation film;
   a second conductivity type second diffusion layer that is one of a source region and a drain region, and is located in the first diffusion layer to one side of the gate electrode in a channel length direction;
   a second conductivity type third diffusion layer that is the other of the source region and the drain region, and is located in the semiconductor layer to the other side of the gate electrode in the channel length direction;
   a plurality of first conductivity type fourth diffusion layers that are located in the second diffusion layer and are electrically connected to the first diffusion layer;
   an insulation film that is located over the semiconductor layer, the first diffusion layer, and the gate electrode;
   a plurality of first contact holes that are located in the insulation film, and are located over the second diffusion layer and the fourth diffusion layer; and
   a plurality of second contact holes that are located in the insulation film, and are located over the third diffusion layer,
   wherein the plurality of fourth diffusion layers are located along the gate electrode, and each of the plurality of fourth diffusion layers is surrounded by the second diffusion layer,
   the plurality of first contact holes are located along the gate electrode,
   the plurality of second contact holes are located along the gate electrode, and
   a pitch of the plurality of fourth diffusion layers is larger than a pitch of the plurality of first contact holes.

2. The semiconductor device according to claim 1, wherein the plurality of fourth diffusion layers are located in a line along the gate electrode,
   the plurality of first contact holes are located in a line along the gate electrode,
   the plurality of second contact holes are located in a line along the gate electrode, and
   the pitch of the plurality of first contact holes is the same as the pitch of the plurality of second contact holes.

3. The semiconductor device according to claim 1, wherein the plurality of first contact holes include a contact hole that overlaps with the second diffusion layer and does not overlap with the fourth diffusion layer, and a contact hole that overlaps with the fourth diffusion layer and does not overlap with the second diffusion layer.

4. The semiconductor device according to claim 3, wherein the plurality of first contact holes include a contact hole that overlaps with the second diffusion layer and the fourth diffusion layer.

5. The semiconductor device according to claim 3, wherein at least one of the plurality of fourth diffusion layers does not overlap with any of the plurality of first contact holes.

6. The semiconductor device according to claim 1, wherein the plurality of first contact holes include a contact hole that establishes contact with the second diffusion layer and a contact hole that establishes contact with the fourth diffusion layer.

7. The semiconductor device according to claim 6, wherein the plurality of first contact holes include a contact hole that establishes contact with both the second diffusion layer and one of the fourth diffusion layers.

8. The semiconductor device according to claim 6, wherein at least one of the plurality of fourth diffusion layers does not have contact with any of the plurality of first contact holes.

* * * * *